(12) United States Patent
Song et al.

(10) Patent No.: US 7,712,008 B2
(45) Date of Patent: *May 4, 2010

(54) SYSTEMS AND METHODS FOR ERROR REDUCTION ASSOCIATED WITH INFORMATION TRANSFER

(75) Inventors: Hongwei Song, Longmont, CO (US); Weijun Tan, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 1109 days.

This patent is subject to a terminal disclaimer.

(21) Appl. No.: 11/341,963

(22) Filed: Jan. 26, 2006

(65) Prior Publication Data

US 2007/0192666 A1    Aug. 16, 2007

(51) Int. Cl.
*H03M 13/00* (2006.01)

(52) U.S. Cl. ........................ 714/755; 714/780

(58) Field of Classification Search ........ 714/755, 714/780
See application file for complete search history.

(56) References Cited

U.S. PATENT DOCUMENTS

| | | | | |
|---|---|---|---|---|
| 5,392,299 A * | 2/1995 | Rhines et al. | ............... | 714/756 |
| 5,612,964 A * | 3/1997 | Haraszti | ............... | 714/763 |
| 5,898,710 A * | 4/1999 | Amrany | ............... | 714/786 |
| 5,983,383 A * | 11/1999 | Wolf | ............... | 714/755 |
| 6,023,783 A * | 2/2000 | Divsalar et al. | ............... | 714/792 |
| 6,029,264 A * | 2/2000 | Kobayashi et al. | ............... | 714/755 |
| 6,216,251 B1 * | 4/2001 | McGinn | ............... | 714/800 |
| 6,266,795 B1 * | 7/2001 | Wei | ............... | 714/755 |
| 6,351,832 B1 * | 2/2002 | Wei | ............... | 714/701 |
| 6,377,610 B1 * | 4/2002 | Hagenauer et al. | ............... | 375/136 |
| 6,473,878 B1 * | 10/2002 | Wei | ............... | 714/755 |
| 6,625,775 B1 * | 9/2003 | Kim | ............... | 714/755 |
| 6,810,502 B2 * | 10/2004 | Eidson et al. | ............... | 714/786 |
| 7,010,051 B2 * | 3/2006 | Murayama et al. | ............... | 375/262 |
| 7,047,474 B2 * | 5/2006 | Rhee et al. | ............... | 714/755 |
| 7,093,179 B2 * | 8/2006 | Shea | ............... | 714/755 |
| 7,257,764 B2 * | 8/2007 | Suzuki et al. | ............... | 714/774 |
| 7,310,768 B2 * | 12/2007 | Eidson et al. | ............... | 714/786 |
| 2005/0216819 A1 * | 9/2005 | Chugg et al. | ............... | 714/786 |
| 2005/0273688 A1 | 12/2005 | Argon | | |
| 2006/0031737 A1 * | 2/2006 | Chugg et al. | ............... | 714/755 |
| 2006/0140311 A1 | 6/2006 | Ashley et al. | | |
| 2006/0168493 A1 * | 7/2006 | Song | ............... | 714/752 |

OTHER PUBLICATIONS

Li Ping; Modified turbo codes with low decoding complexity; Electronics Letters, vol. 34, Issue 23, Nov. 12, 1998 pp. 2228-2229.*
Prosecution History re: U.S. Appl. No. 11/041,694, printed from http://www.uspto.gov on Jun. 5, 2009, pp. 1-117.

* cited by examiner

*Primary Examiner*—Joseph D Torres
(74) *Attorney, Agent, or Firm*—Hamilton, DeSanctis & Cha

(57) ABSTRACT

Various systems and methods for error reduction in a digital information system are disclosed herein. As one example, a digital storage system is provided that includes a soft output Viterbi algorithm channel detector operable to receive an encoded data set, and to provide a hard and a soft output representing the encoded data set. The hard and the soft output from the soft output Viterbi algorithm channel detector are provided to a single parity row decoder that provides another hard output that is an error reduced representation of the encoded data set. The encoded data set is additionally provided from the buffer to another channel detector via a delay element. The hard output from the single parity row decoder and the time shifted encoded data set are provided to coincident with each other to another channel detector.

15 Claims, 8 Drawing Sheets

SYSTEMS AND METHODS FOR ERROR REDUCTION ASSOCIATED WITH INFORMATION TRANSFER

CROSS REFERENCE TO RELATED APPLICATIONS

The present application is related to U.S. patent application Ser. No. 11/041,694 entitled "Data Detection and Decoding System and Method", filed Jan. 24, 2005 by Song, and assigned to an entity common hereto. The aforementioned document is incorporated herein by reference for all purposes.

BACKGROUND OF THE INVENTION

The present invention is related to systems and methods for detecting and decoding digital information. More particularly, the present invention relates to systems and methods for detecting and correcting errors associated with an information transfer.

Digital communication systems (e.g., sets of wireless communication devices) and digital storage systems-(e.g., hard disk drives) provide for transfer of different types of information. For example, in the case of communication systems, digital information is transferred substantially in real time from one communication device to another. In contrast, digital information transfer involving digital storage systems typically involves a non-real time transfer of digital information that was previously stored to a storage device. While there are fundamental differences between the aforementioned information transfer approaches, the general goal of both approaches is to transfer information as accurately as possible in the presence of impairments such as noise and inter-symbol interference (ISI).

The goal of increasing the accuracy of information transfer has fueled development of progressively more complex information transfer approaches that include increasingly elaborate error correcting schemes (ECSs). As an example, a state of the art information transfer approach may include a substantial number of parity bits built into the information being transferred. These parity bits introduce redundancy into the signal prior to transmission, and are subsequently used to decode the encoded information. FIG. 1 depicts an exemplary state of the art transfer system tailored for a digital storage system. It should be noted that a typical state of the art system tailored for a digital communication system would typically include the same level of complexity or possibly greater.

Turning to FIG. 1, a block diagram is provided for a known digital storage system 1 that utilizes an elaborate row and column parity approach for error detection and correction. Digital storage system 1 includes an encoder 2 that encodes information bits by interleaving parity bits throughout the original information. Encoder 2 is typically a two-dimensional product code (TPC) encoder. After the original information is encoded, it is provided to recording channel 3 that typically includes various physical and electrical components, such as a read/write head, a read/write head armature, a recording media, a pre-amplifier, or other related circuitry or components.

The encoded information is passed from recording channel 3 to a soft output Viterbi algorithm (SOVA) channel detector 4. SOVA channel detector 4 processes the received encoded information using a bit detection algorithm. The output of SOVA channel 4 includes a combination of hard decisions and reliability estimates (i.e., respective estimates as to the reliability of the respective hard decisions). Both the soft and hard outputs of SOVA channel detector 4 are provided to a decoder 5 that is responsible for de-interleaving the parity bits and decoding the recovered information bits using the parity bits.

Operation of digital storage system 1 is exemplified where original information (e.g., uk=010110) is to be stored in recording channel 3. This original information is represented by Table 1 below.

TABLE 1

| Original Information (uk) | |
|---|---|
| 0 | 1 |
| 1 | 1 |
| 0 | 0 |

The original information, uk, is provided to encoder 2 that encodes the information. Where it is assumed that encoder 2 is a two-dimensional product (TPC) encoder, a parity bit is added to each row and to each column of table 1 to produce an even parity code (i.e., each column and each row contains an even number of 1's). Thus, the original information represented by a 3×2 table is formed into encoded information, ck, that is formed in a 4×3 table. The parity laden 4×3 table is represented as table 2 below.

TABLE 2

| Original Information Interleaved with Parity (ck) | | |
|---|---|---|
| 0 | 1 | 1 |
| 1 | 1 | 0 |
| 0 | 0 | 0 |
| 1 | 0 | 1 |

For simplicity, the example assumes that each column of table 2 corresponds to a single parity codeword. However, in a typical implementation, this would not be the case as the parity bits would be pseudo-randomly interleaved throughout the original information bits, rather than being placed at the end of each column and row. Thus, a typical implementation would be much more complex.

In this example, the resulting codeword, ck=010111001001, is recorded by recording channel 3. When retrieved from recording channel 3, a signal xk provided from recording channel 3 may be corrupted by noise, nk, resulting in a corrupted signal yk. The noise, nk, may be, for example, additive Gaussian noise. SOVA channel detector 4 receives the corrupted signal, yk, and produces hard decisions and corresponding soft reliability estimates. Decoder 5 receives the output of SOVA channel detector 4 and decodes the output to recover the original information using the interleaved parity information.

In some embodiments, the parity bits may be used in an iterative decoder and detection approach to increase accuracy of the recovered information. An exemplary system 60 using such an iterative decoder and detection approach to increase the accuracy of the recovered information is shown in FIG. 2. A first SOVA channel detector 61 processes information from the read channel, and provides a combination of hard and soft outputs representing the original information and interleaved parity bits. This combination of hard and soft outputs are provided to a first stage decoder 62. First stage decoder 62 includes a row detector 63 and a column detector 64, and a row decoder 66 and a column decoder 67. In addition, first stage decoder 62 includes a delay element 65, and a collection of summers 68, 69 and 71.

The encoded bits are stored in the read channel (not shown) in a table comprising rows and columns such as Table 2 above. Row decoder 63 receives the hard and soft detector outputs from SOVA channel detector 61, and uses the hard and soft detector outputs to decode the rows. Similarly, column decoder 64 receives the hard and soft detector outputs from SOVA channel detector 61, and uses the hard and soft detector outputs to decode the columns. Row decoder 63 and column decoder 64 generate outputs that are combined by summers 68 and 69 with the outputs of SOVA channel detector 61 delayed by delay element 65. The combination of the outputs of SOVA channel detector 61 and column decoder 64 are provided to another row decoder 66. Likewise, the combination of the outputs of SOVA channel detector 61 and row decoder 63 are provided to another column decoder 67. The data provided to row decoder 66 and column decoder 67 is used to decode the respective rows and columns. In particular, row decoder 66 uses information generated by column decoder 64 to further decode the rows, and column decoder 67 uses information generated by row decoder 63 to further decode the rows. This type of iteration in the decoder requires both column and row decoders because each uses information from the other to make decoding decisions.

In addition, there is an iteration between the detector and decoder processes. As shown in FIG. 2, the outputs of the row decoder 66 and column decoder 67 are combined by summer 71 and provided to another SOVA channel detector 72 and to a delay element 73. SOVA channel detector 72 also receives the same input that was provided to SOVA channel detector 61 after passing through delay element 75. SOVA channel detector 72 generates soft and hard outputs that are combined by a summer 74 with the combined outputs of the row decoder 66 and column decoder 67 as delayed by delay element 73. This information is then provided to another channel decoder 76.

Channel decoder 76 provides the same processing implemented by channel decoder 62, thus providing the iterative approach to decoding. Channel decoder 76 includes components 83-91 that correspond to similar components 63-71, respectively. In addition, channel decoder 76 includes a delay element 92 that provides a time delay that is equal to the time delay provided by a delay element 85. The outputs of row decoder 86 and column decoder 87 of channel decoder 76 are combined by a summer 91 with the delayed input to channel decoder 76. The result is the recovered original information bits after a double pass iteration that typically provides for greater error protection.

As will be appreciated from the preceding discussion, while system 60 intuitively provides a reduction in errors, system 60 requires a substantial amount of circuitry. In particular, implementing system 60 involves duplicating detection and decoding logic, and memory. Consequently, system 60 consumes a relatively large amount of area on a semiconductor die, and is also relatively inefficient in terms of power consumption. In addition, all of the iterative processing takes a relatively large amount of time to be performed, which decreases the overall speed of the system. Further, the approach of system 60 may not provide sufficient error reduction even where the increased costs of space and power are sustainable.

Hence, for at least the aforementioned reasons, there exists a need in the art for advanced systems and methods for error reduction.

BRIEF SUMMARY OF THE INVENTION

The present invention is related to systems and methods for detecting and decoding digital information. More particularly, the present invention relates to systems and methods for detecting and correcting errors associated with an information transfer scenario.

Various embodiments of the present invention provide for digital storage systems that include a storage medium storing an encoded data set accessible via a buffer. The systems further include a soft output Viterbi algorithm channel detector operable to receive the encoded data set, and to provide hard and soft outputs representing the encoded data set. The hard and soft outputs from the soft output Viterbi algorithm channel detector are provided to a single parity row decoder, which that provides another hard output that is an error reduced representation of the encoded data set. The encoded data set is additionally provided from the buffer to another channel detector via a delay element. The delay element time shifts the encoded data set. The hard output from the single parity row decoder and the time shifted encoded data set are provided coincident with each other to another channel detector. This other channel detector provides a recovered output that exhibits a reduction in errors compared with the encoded data set.

In one particular instance of the aforementioned embodiments, the other channel decoder is a hard output Viterbi algorithm channel detector, and the recovered output is a hard output. In such instances, the digital storage systems may further include a Reed Solomon decoder that receives the recovered output, and is operable to further reduce any errors exhibited in the recovered output. In other instances of the aforementioned embodiments, the single parity row decoder, the delay element, and the other channel detector form an iterative stage where the other channel detector provides hard and soft outputs. The hard and soft outputs are provided to another similar iterative stage along with the encoded data set after passing through a delay element. This information is processed by the other iterative stage to form another recovered output that exhibits additional error reduction when compared with the recovered output from the prior iterative stage. Further, some instances of the aforementioned embodiments include a single parity row by row encoder operable to encode an original data set with at least one parity bit decodable by the single parity row decoder to create the encoded data set. This encoded data set may be stored to the storage medium. In some cases, the parity bit is provided to effectuate either odd or even parity.

Other embodiments of the present invention provide methods for error reduction in an electronic system. Such methods include processing an encoded data set using a channel detector that provides a hard output and a soft output. The hard output represents a predicted bit value and the soft output represents a reliability value. The methods further include processing the hard output and the soft output using a single parity row decoder that in turn provides a hard output. In addition, the encoded data set is provided to a delay element to form a time shifted encoded data set. This time shifted encoded data set is provided coincident with the hard output of the single parity row detector to another channel detector for additional processing. The other channel detector processes the received inputs to form a recovered output that exhibits a reduction in errors compared with the encoded data set.

In some cases of the aforementioned embodiments, the methods further include receiving an initial data set, and encoding the initial data set using a single parity row by row encoder that incorporates a single parity bit into the initial data set on a row by row basis to form the encoded data set. In such cases, the single parity row decoder is limited to performing error correction on a row by row basis based on the single parity. In various cases, the methods further includes transferring the encoded data set to the first channel detector from a source that may be, for example, a storage medium or a communication receiver. In yet other cases of the aforementioned embodiments, processing is performed in iterative stages where an iterative stage includes at least a single parity row decoder and a channel detector. In such cases, the methods may include performing processing across multiple iterative stages.

Yet other embodiments of the present invention provide for digital information systems that include a channel detector operable to receive an encoded data set, and to provide a hard output and a soft output representative of the encoded data set. The hard output and the soft output from the channel detector are provided to a single parity row decoder that provides a hard output that is an error reduced representation of the encoded data set. The systems further include a delay element that receives the encoded data set and provides a time shifted encoded data set. The hard output from the single parity row decoder is provided to another channel detector coincident with the time shifted encoded data set. The other channel detector provides a recovered output that exhibits a reduction in errors compared with the encoded data set.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
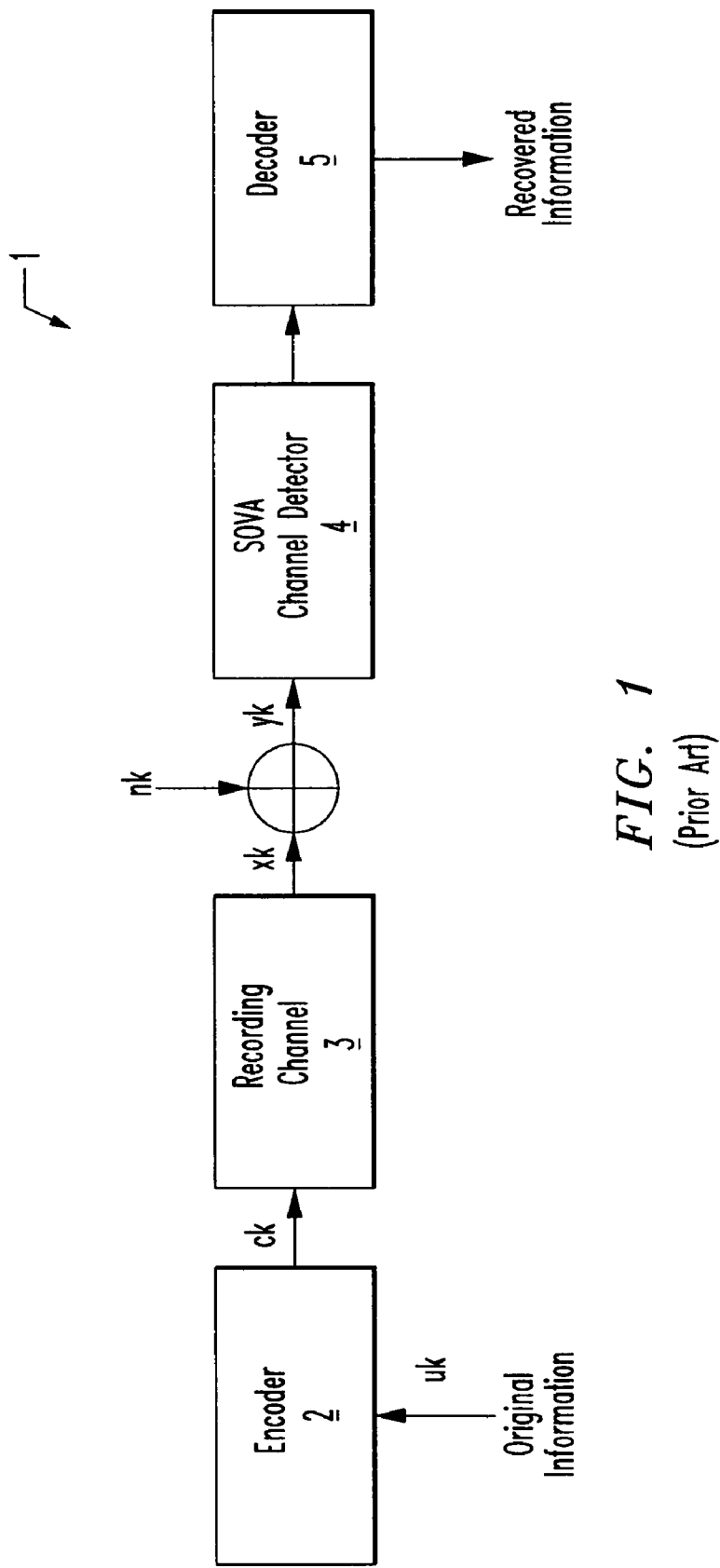
FIG. 1 is a block diagram of a known digital recording system including a SOVA channel detector and a decoder implementing an error correction scheme utilizing both row and column parity.

The present invention is related to systems and methods for detecting and decoding digital information. More particularly, the present invention relates to systems and methods for detecting and correcting errors associated with an information transfer scenario.

Some embodiments of the present invention provide methods for error reduction in an electronic system. As used herein, the phrase "error reduction" is used in its broadest sense to mean any reduction in differences between an original data set and a recovered data set. The aforementioned methods may include processing an encoded data set using a channel detector that provides both a hard output and a soft output. As used herein, the phrases "hard output" and "soft output" are given their general meaning in the art where a hard output is a predicted bit value, and a soft output is an associated reliability value. Further, as used herein, the phrase "encoded data set" is used in its broadest sense to mean any data set that has been modified such that the data set must be decoded to recover the original data set. Thus, as just one example, an encoded data set may be modified to include error correction data in addition to the original data set. As used herein, the phrase "error correction data" is used in its broadest sense to mean any information whether it be a single bit or a collection of bits that may be used to detect and/or correct an error. Thus, error correction data may be, but is not limited to, a parity bit, a group of parity bits, and/or a checksum.

The aforementioned methods further include processing the hard output and the soft output from the channel detector using a single parity row decoder that in turn provides a hard output. In addition, the encoded data set is provided to a delay element to form a time shifted encoded data set. As used herein, the phrase "delay element" is used in its broadest sense to mean any circuit, device or system capable of time shifting an electrical and/or data signal. Thus, for example, a delay element may be, but is not limited to, a clocked register or flip-flop, or some combinatorial logic with a predictable propagation delay. The other channel detector processes the received inputs to form a recovered output that exhibits a reduction in errors compared with the encoded data set.

In some cases of the aforementioned embodiments, processing can be performed across multiple iterative stages where an iterative stage includes at least a single parity row decoder and a channel detector. As used herein, the phrase "iterative stage" is used in its broadest sense to mean any collection of elements or operations that can be substantially replicated. Thus, as just one of many examples, a first iterative stage may include a row decoder feeding a soft output Viterbi algorithm channel detector, and a second iterative stage may include a similar row decoder feeding a hard output Viterbi algorithm decoder.

Yet other embodiments of the present invention provide for digital information systems that include a channel detector operable to receive an encoded data set, and to provide a hard output and a soft output representative of the encoded data set. The hard output and soft output from the channel detector are provided to a single parity row decoder that provides a hard output that is an error reduced representation of the encoded data set. The systems further include a delay element that receives the encoded data set and provides a time shifted encoded data set. The hard output from the single parity row decoder is provided to another channel detector coincident with the time shifted encoded data set. As used herein, the term "coincident" is used in its broadest sense. As one example, where the encoded data set includes a series of bits and where one bit of the series of bits is processed in the row decoder and channel detector to provide a processed output, providing the processed output coincident with the time shifted encoded data set means providing the processed output at substantially the same time (i.e., within a processing window of time) as the bit of the encoded data set used to form the processed output.

Various embodiments of the present invention provide systems and methods that combine channel detector and iterative codes to reliably reconstitute transferred information. In some cases, the information is transferred from a storage medium such as a hard disk drive, a tape recording system, an optical disk drive, or the like. Using embodiments of the present invention, accessed information exhibiting a low signal to noise ratio may be reconstituted with a high correcting effect, which decreases random and/or burst errors exhibited in an original information signal. The correcting effect offered by various embodiments of the present invention may be used, for example, to facilitate digital data recording at very high densities where signal to noise ratio can be an inhibiting design consideration.

Figure 3:
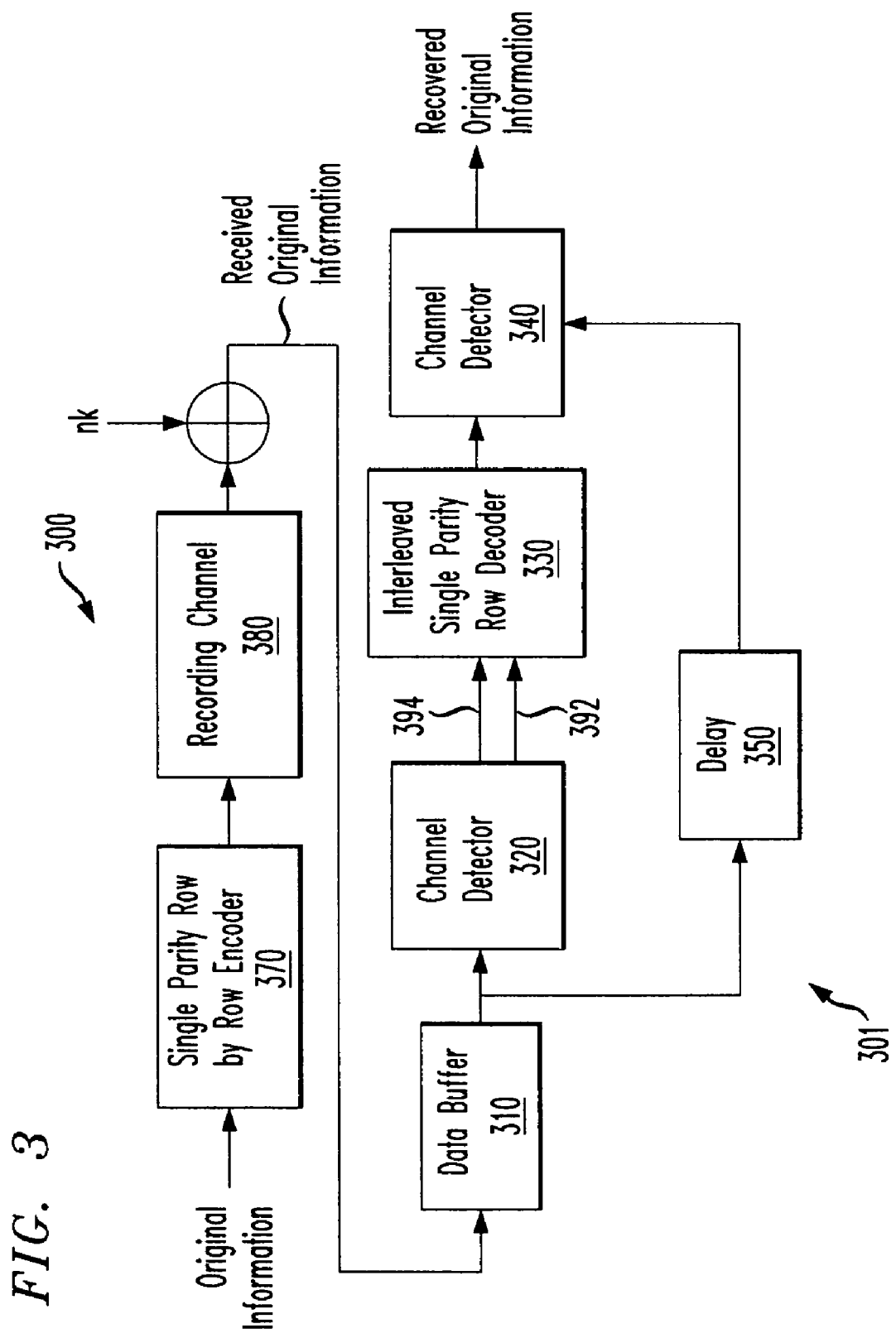
FIG. 3 is a block diagram of a digital storage system including an interleaved single parity error correction system in accordance with one or more embodiments of the present invention.

FIG. 3 depicts a digital storage system 300 including an interleaved single parity error correction system in accordance with one or more embodiments of the present invention. Digital storage system 300 includes a single parity row by row encoder 370, a recording channel 380, and an interleaved single parity error correction system 301. Interleaved single parity error correction system includes a data buffer 310, a first channel detector 320 (e.g., a SOVA channel detector), an interleaved single parity row decoder 330, a second channel detector 340 (e.g., hard output Viterbi algorithm (HOVA) channel detector), and a delay element 350.

Recording channel 380 may be any recording channel known in the art. Such a recording channel typically includes both physical and electrical components (not shown), such as a read/write head, a read/write head armature, a recording media, a pre-amplifier, and/or the like. Single parity row by row encoder 370 receives original information and pseudo-randomly interleaves a parity bit on a row by row basis. As used herein, the term "row" is used in its very broadest sense to mean any string of two or more bits. Thus, a row may be, but is not limited to, a string of bits arranged horizontally in an array of information, a string of bits arranged vertically in an array of information, or a string of bits forming part of a serial data stream. As an example, Table 3 represents an original information received by single parity row by row decoder 370, and Table 4 exemplifies the same original information after encoding by single parity row by row encoder 370. In this example, a row is assumed to be four bits, odd parity (i.e., an odd number of '1' bits) is used, and the parity bits are placed in quotes.

It should be noted that while the preceding example utilizes odd parity, even parity alternatively may be used.

Data buffer 310 may be any circuit, system or device capable of receiving original information and maintaining a copy of the original information for a desired period. In one example, the original information is a series of analog values that are to be maintained in data buffer 310 as digital values. In such a case, data buffer 310 may be a memory register driven by, for example, a six-bit analog to digital converter. The original information is provided to the analog to digital converter where it is converted to a six-bit digital value representing one bit of the original information. The six-bit digital value is then stored to the memory register. Based on the disclosure provided herein, one of ordinary skill in the art will recognize that an analog to digital converter with a different resolution may be used, or that in particular instances an analog to digital decoder may not be necessary depending upon the type of original information that is received.

Channel detector 320 may be any channel detector known in the art. In one particular embodiment of the present invention, channel detector 320 is a soft-input, soft output (SISO) channel detector such as, for example, a soft output Viterbi algorithm (SOVA) channel detector. Such a SOVA channel detector implements a Viterbi algorithm to minimize transmission errors by computing the most likely state sequence of a soft decision input. The SOVA channel detector then provides its prediction as a combination of soft and hard outputs comprising a predicted output value 392 (i.e., a hard output), along with a reliability value 394 (i.e., a soft output). In one particular embodiment of the present invention using a SOVA channel detector, hard output 392 from channel detector 320 is a single binary bit, and soft output 394 is an eight bit word indicating a confidence percentage from fifty percent to one hundred percent. Based on the disclosure provided herein, one of ordinary skill in the art will recognize that soft output 394 may include more or fewer than eight bits, and that the represented reliability may be something other than a percentage. The hard and soft outputs of the SOVA channel detector are formed by calculating the different input possibilities of a specific output symbol and then assigning a confidence level to those inputs that have a higher probability of actually having occurred as is known in the art. Based on the disclosure provided herein, one of ordinary skill in the art will recognize other channel detectors that may be used in relation to one or more embodiments of the present invention.

Interleaved single parity row decoder 330 is a single parity decoder that provides for decoding using the single parity pseudo-randomly interleaved by row encoder 370. Where channel detector 320 is a soft output channel detector, inter-

TABLE 3

Original Information

| 0 | 1 | 1 | 1 | 1 | 1 | 0 | 1 | 0 | 0 | 0 | 0 | 1 | 0 | 1 | 0 |

TABLE 4

Original Information with Pseudo Randomly Interleaved Parity

| 0 | "0" | 1 | 1 | 1 |
| 1 | 1 | 0 | "0" | 1 |
| 0 | 0 | "1" | 0 | 0 |
| 1 | 0 | 1 | 0 | "1" | leaved single parity row decoder 330 sequentially receives the predicted output values 392 and associated reliability values 394 from channel detector 320. Interleaved single parity row decoder 330 uses a counter to determine when an entire row has been received, and then uses the known parity information (i.e., odd or even parity) along with a combination of the predicted and reliability values to refine the soft output (i.e., reliability values 394) provided by channel detector 320 to form a refined reliability value 393. Refined reliability value 393 is provided to channel detector 340. In particular embodiments of the present invention, refined reliability value 393 is a six bit value representing an offset from reliability value 392. Thus, for example, where reliability value 392 indicated an eighty percent reliability and interleaved single parity row decoder 330 refines that reliability to ninety percent, refined reliability value 393 would indicate positive ten percent. Similarly, where interleaved single parity row decoder 330 reduces reliability value 392 down to forty percent, refined reliability value 393 would indicate negative forty percent. Based on the disclosure provided herein, one of ordinary skill in the art will recognize a variety of design and configuration details that may be employed in relation to interleaved single parity row decoder 330, and a number of approaches for representing the refined reliability value. Further, based on the broad definition of the term "row", one of ordinary skill in the art will recognize that interleaved single parity row decoder may be implemented as either a row decoder or a column decoder.

Delay element 350 causes the received original information to arrive at channel detector 340 coincident with the same information processed by channel detector 320 and row decoder 330. In some cases, delay element 350 is a clocked register where the number of clock cycles required for moving an input to the output is equivalent to the number of clock cycles required to process information through channel detector 320 and interleaved single parity row detector 330. Based on the disclosure provided herein, one of ordinary skill in the art will appreciate a variety or circuits, systems and/or devices that may be used to implement a delay consistent with the described operation of delay element 350.

Channel detector 340 may be any channel detector known in the art. In one particular embodiment of the present invention, channel detector 340 is a soft-input, hard output (SIHO) channel detector such as, for example, a hard output Viterbi algorithm (HOVA) channel detector. Such a HOVA channel detector implements a Viterbi algorithm to minimize transmission errors by computing the most likely state sequence of a soft decision input. Based on the computation, the hard output Viterbi algorithm channel detector provides a recovered original information output (i.e. a hard output).

Channel detector 340 operates similar to channel detector 320 except that in the illustrated embodiment, channel detector 340 provides only a hard output (i.e., the recovered original information). More particularly, channel detector 340 receives the same input provided to channel detector 320 along with refined reliability value 393. Without the addition of refined reliability value 393, channel detector 340 may provide a hard output equivalent to the hard output provided by channel detector 320. However, channel detector 340 utilizes refined reliability value 393 to further refine the processing the received original information (i.e., information received via delay 350) and reduce errors in the output recovered original information. As will be appreciated by one of ordinary skill in the art, the recovered information may include some errors that either were not detectable, or possibly were not correctable.

Figure 4:
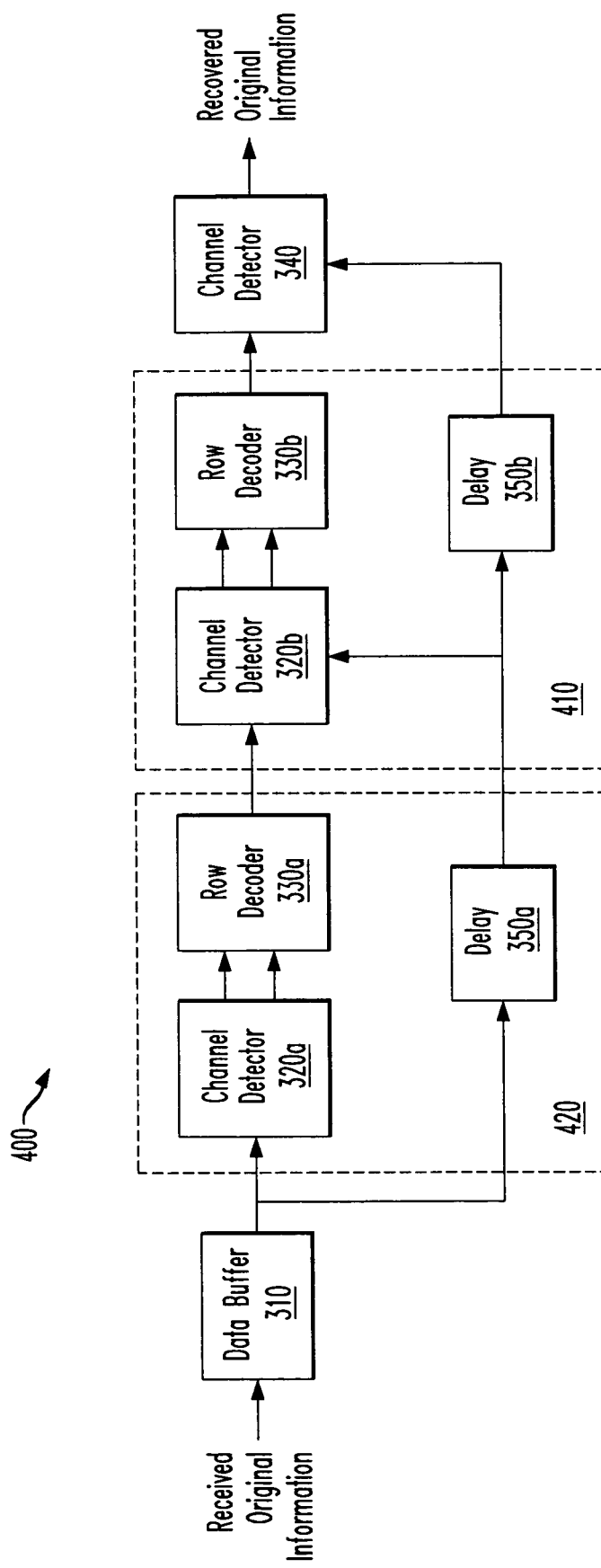
FIG. 4 is a block diagram of an iterative, interleaved single parity error correction system in accordance with various embodiments of the present invention.

Turning to FIG. 4, a block diagram of an iterative, interleaved single parity error correction system 400 in accordance with various embodiments of the present invention is shown. Error correction system 400 includes two iterative stages 410, 420. Both iterative stages 410, 420 include a channel detector 320, a row decoder 330, and a delay element 350. In operation, the received original information is registered by data buffer 310. This buffered information is provided to channel detector 320a of iterative stage 420 that processes the information and provides predicted values (i.e., hard output) and reliability values (i.e., soft output) corresponding to the original information from which the received original information is derived. The predicted and reliability values are provided to row decoder 330a that uses the known parity information (i.e., odd or even parity) along with a combination of the predicted and reliability values to detect and correct bit errors. A stream of refined reliability values (i.e., soft outputs) that corresponds to the original information is then output to channel detector 320b of iterative stage 410.

Channel detector 320b additionally receives the received original information from data buffer 310 via delay element 350a. Delay element 350 causes the received original information to arrive at channel detector 320b coincident with the same information processed by channel detector 320a and row decoder 330a. Channel detector 320b processes the information received from row decoder 330a and delay element 350a and provides predicted values and reliability values corresponding to the original information from which the received original information is derived. The predicted and reliability values are provided to row decoder 330b that uses the known parity information (i.e., odd or even parity) along with a combination of the predicted and reliability values to detect and correct bit errors. A stream of refined reliability values (i.e., soft outputs) that corresponds to the original information is then output to channel detector 340. Channel detector 340 receives the output of row decoder 330b and the received original information maintained in data buffer 310 via two delay elements 350a, 350b. Based on this input information, channel detector 340 performs additional error detection and correction as is known in the art, and provides the recovered original information. Again, it will be appreciated by one of ordinary skill in the art, the recovered information may include some errors that either were not detectable, or possibly were not correctable.

Use of multiple iterative stages as demonstrated by error correction system 400 can lead to additional reduction in errors when compared with a corresponding single stage system. Thus, based on the disclosure provided herein, one of ordinary skill in the art will recognize that while error correction system 400 includes two iterative stages, embodiments of the present invention may include three or more iterative stages depending upon design requirements including die area, power and error rate requirements. It should be noted that it is not necessarily useful to arbitrarily increase the number of iterative stages as the level of error correction offered by an iterative error correction system will eventually saturate.

Figure 5A:
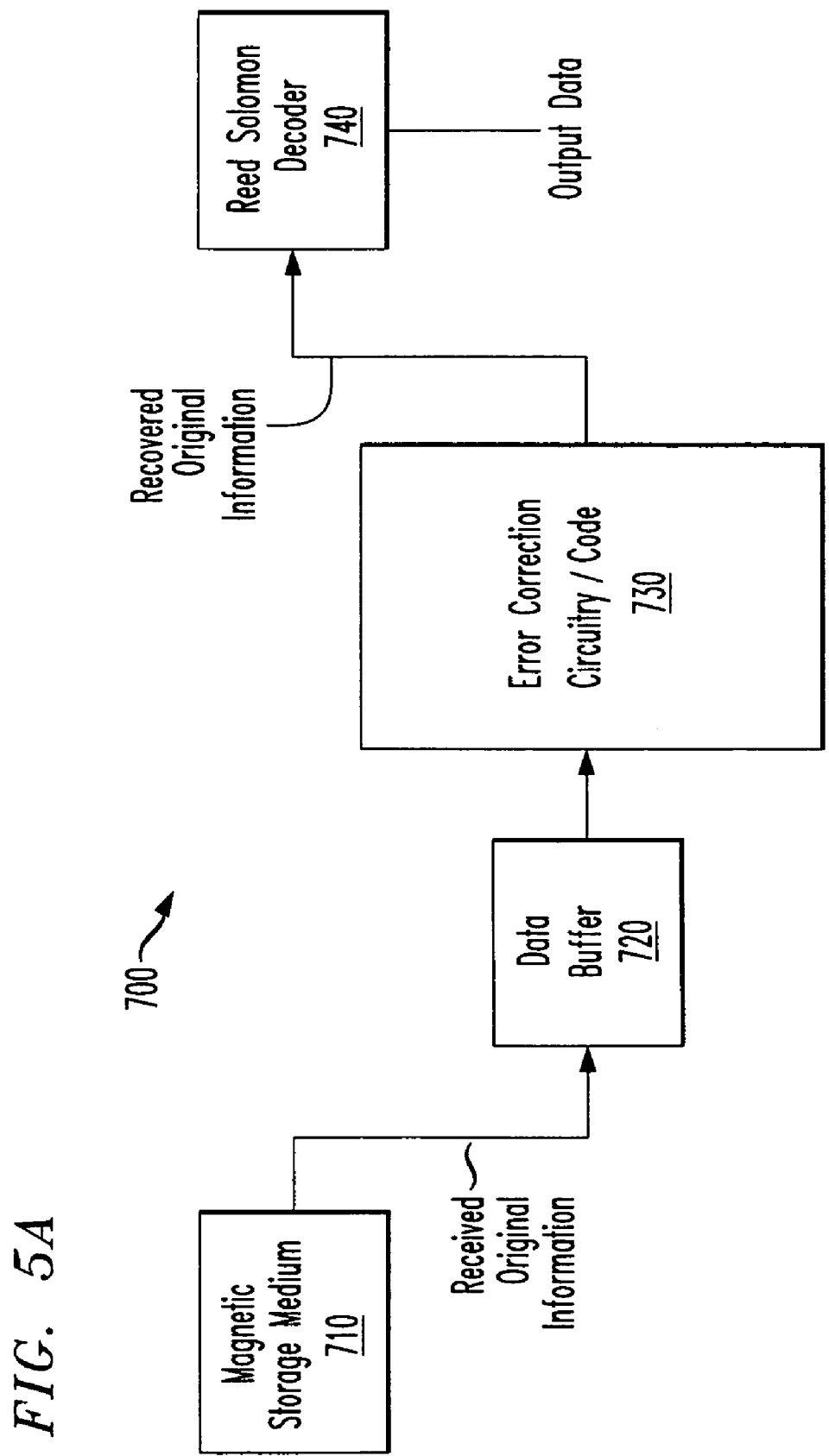
FIG. 5A is a block diagram of a digital storage system utilizing an error correction scheme in accordance with particular embodiments of the present invention.

Turning now to FIG. 5A, a block diagram of a digital storage system 700 utilizing an error correction scheme in accordance with particular embodiments of the present invention is depicted. Digital storage system 700 includes a magnetic storage medium 710 storing data that can be read into a data buffer 720. The data received by data buffer 720 corresponds to the received original information previously discussed in relation to FIGS. 3 and 4. The information maintained by data buffer 720 is provided to an error correction circuitry/code 730. Error correction circuitry/code 730 includes channel detector 320, interleaved single parity row decoder 330, channel detector 340, and delay element 350 arranged as depicted in FIG. 3. The aforementioned elements of error correction circuitry/code may be implemented as software, hardware, or a combination thereof. Error correction circuitry/code 730 provides an output corresponding to the recovered original information previously discussed in relation to FIGS. 3 and 4 to a Reed Solomon decoder 740. Reed Solomon decoder 740 may be any Reed Solomon decoder known in the art, and may be implemented as software, hardware, or a combination thereof. Reed Solomon decoder 740 provides error detection and correction capability in addition to that of error correction circuitry/code 730, and provides the final data output representing the received original information retrieved from magnetic storage medium 710.

Figure 5B:
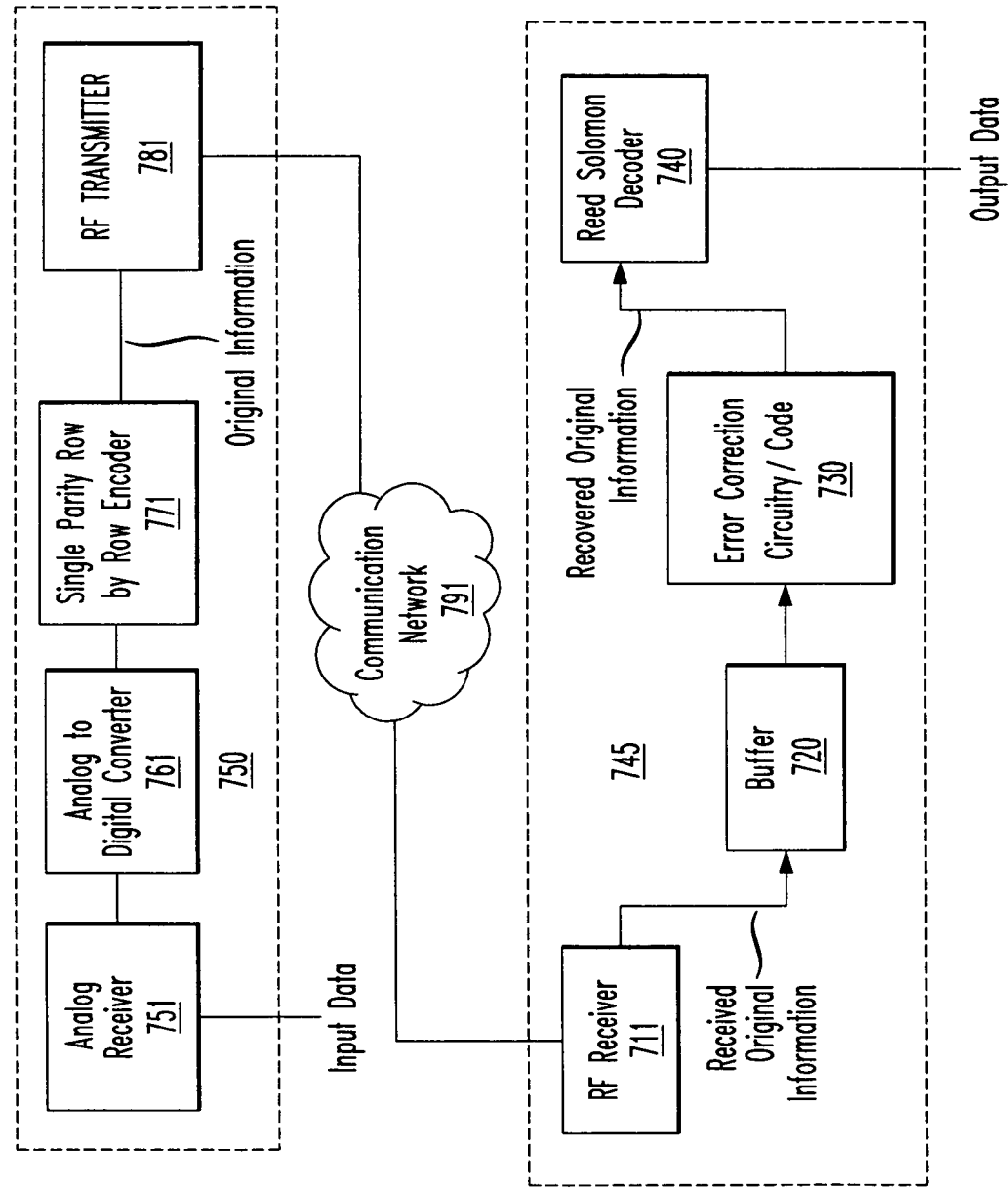
FIG. 5B is a block diagram of a wireless communication system utilizing an error correction scheme in accordance with some embodiments of the present invention.

FIG. 5B shows a block diagram of a wireless communication system 701 utilizing an error correction scheme in accordance with some embodiments of the present invention. Wireless communication system 701 includes a transmission device 750 and a reception device 745. Such devices may be capable of both transmission and reception, and indeed may be incorporated within the same device. For example, transmission device 750 and reception device 745 may be implemented in cellular telephones. Based on the disclosure provided herein, one of ordinary skill in the art will recognize a variety of devices that may implement the functionality of either or both of transmission device 750 and reception device 745. Transmission device 750 is communicably coupled to reception device 745 via a communication network 791. Communication network 791 may be any network capable of passing information between devices. Thus, as just some examples, communication network 791 may be a public cellular telephone system, a radio transmission system, the Internet, and/or the like.

Transmission device 750 includes an analog receiver 751 capable of detecting one or more types of analog signals received as input data. For example, analog receiver 751 may include a microphone capable of detecting voice data, or a pixel array capable of detecting image data. The information detected by analog receiver 751 is provided to analog to digital converter 761 that provides a digital representation of the received input data which is encoded by a single parity row by row encoder 771. Single parity row by row decoder provides similar functionality as that described in relation to single parity row by row decoder 370 described above. The output of single parity row by row encoder 771 corresponds to the original information that will be recovered by reception device 745, and is provided to an RF transmitter 781. Transmitter 781 may be any RF transmitter known in the art that is capable of transmitting an RF signal.

Reception device 745 includes an RF receiver 711. RF receiver 711 may be any RF receiver known in the art that is capable of receiving RF signals transmitted by RF transmitter 781. RF receiver 711 provides information to data buffer 720. The information received by buffer 720 corresponds to the received original information previously discussed in relation to FIGS. 3 and 4. The information maintained by data buffer 720 is provided to the elements discussed in relation to digital storage system 700 including data buffer 720, error correction circuitry/code 73, and Reed Solomon decoder 740.

Figure 6:
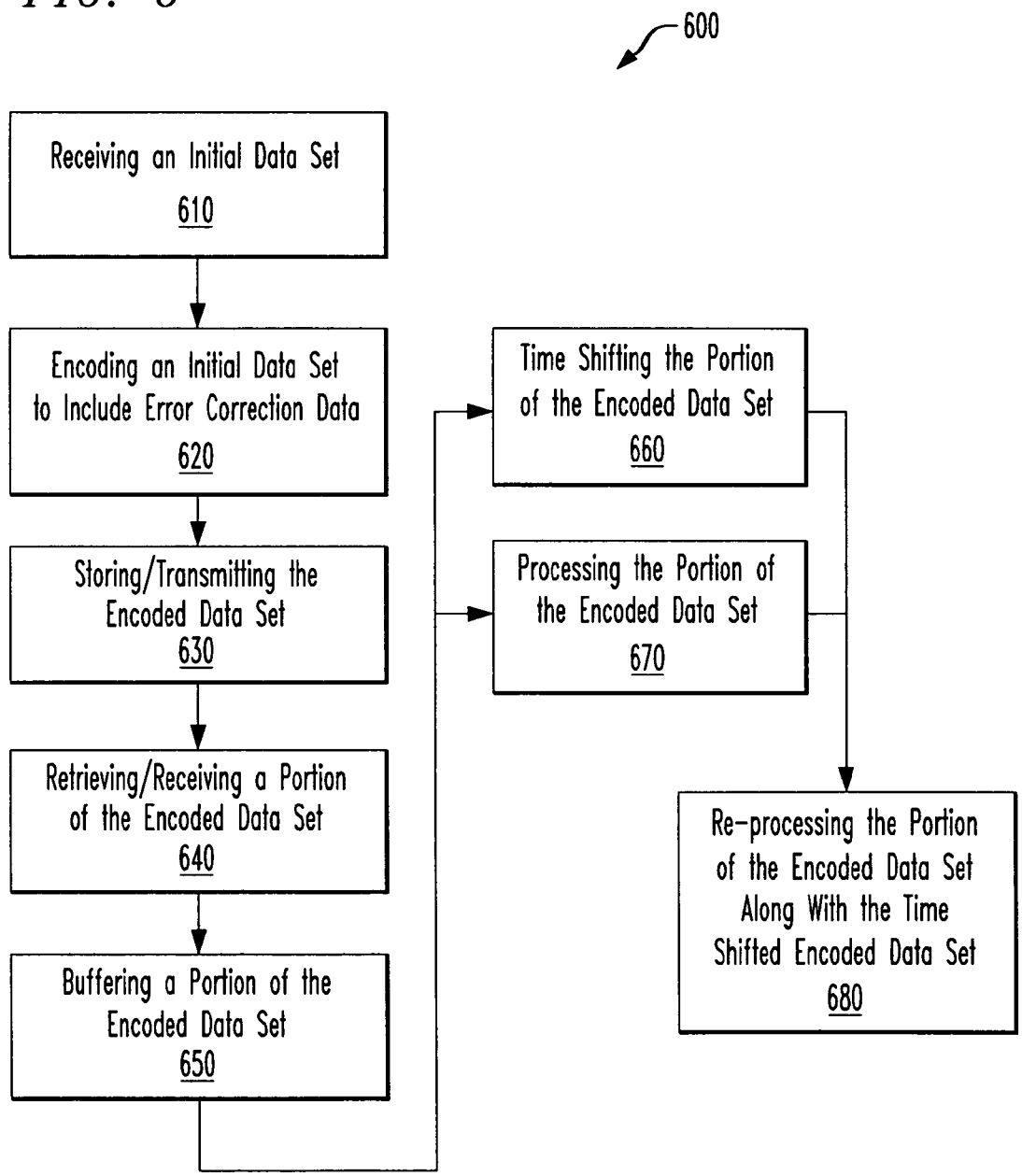
FIG. 6 is a follow diagram depicting a method for detecting and decoding information in accordance with various embodiments of the present invention.

Turning to FIG. 6, a flow diagram 600 depicts a method in accordance with some embodiments of the present invention for error reduction in an electronic system. Following flow diagram 600, an initial data set is received (block 610). This initial data set may be, for example, a document that is to be stored to a hard disk drive, or an audio data set that is to be transmitted via a cellular telephone network. Based on the disclosure provided herein, one of ordinary skill in the art will recognize a variety of data sets that may be used as the initial data set. The initial data set is encoded to include error correction data (block 620). In one case, this error correction data is a single parity bit incorporated on a row by row basis to provide a predicted parity pattern. The encoded data set is then either stored or transmitted depending upon the type of system being utilized (block 630). For example, where it is a digital storage system, the encoded data set may be stored. In contrast, where it is a transmission system, the encoded data set may be stored and/or transmitted.

The encoded data set may then either be retrieved or received depending upon the type of system (block 640), and a portion of the encoded data set may be maintained in a buffer (block 650). The portion of the encoded data set accessed from the buffer is time shifted and processed in parallel (blocks 660, 670). The time shifting may be that described above in relation to the delay elements of FIGS. 3 and 4, and the processing may be that of a row decoder and channel detectors described above in relation to the same figures. The time shifted data and the processed data are provided to another channel detector where they are re-processed (block 680). It should be noted that flow diagram 600 may be expanded to deal with iterative stages. In such a case, the re-processing may result in a hard output where the re-processing is the final or only iterative stage. In contrast, where the re-processing is not performed in the final or only iterative stage, the output from the re-processing may be a combination of hard and soft outputs.

As will be appreciated by one of ordinary skill in the art upon reading this disclosure, various embodiments of the present invention provide a simplified approach to error correction in contrast to the state of the art. In some cases, embodiments of the present invention provide for sufficient error reduction, while at the same time providing for substantial reduction in power and die area when compared to more elaborate schemes, and for quicker operation when compared with other schemes. Further, it has been determined that the simplified approach of the various embodiments of the present invention in some cases actually provides for a reduction in errors when compared to the more elaborate schemes. This result is counter intuitive, and in some cases may be a driving consideration when determining whether to implement an error correction scheme consistent with one or more embodiments of the present invention.

Figure 2:
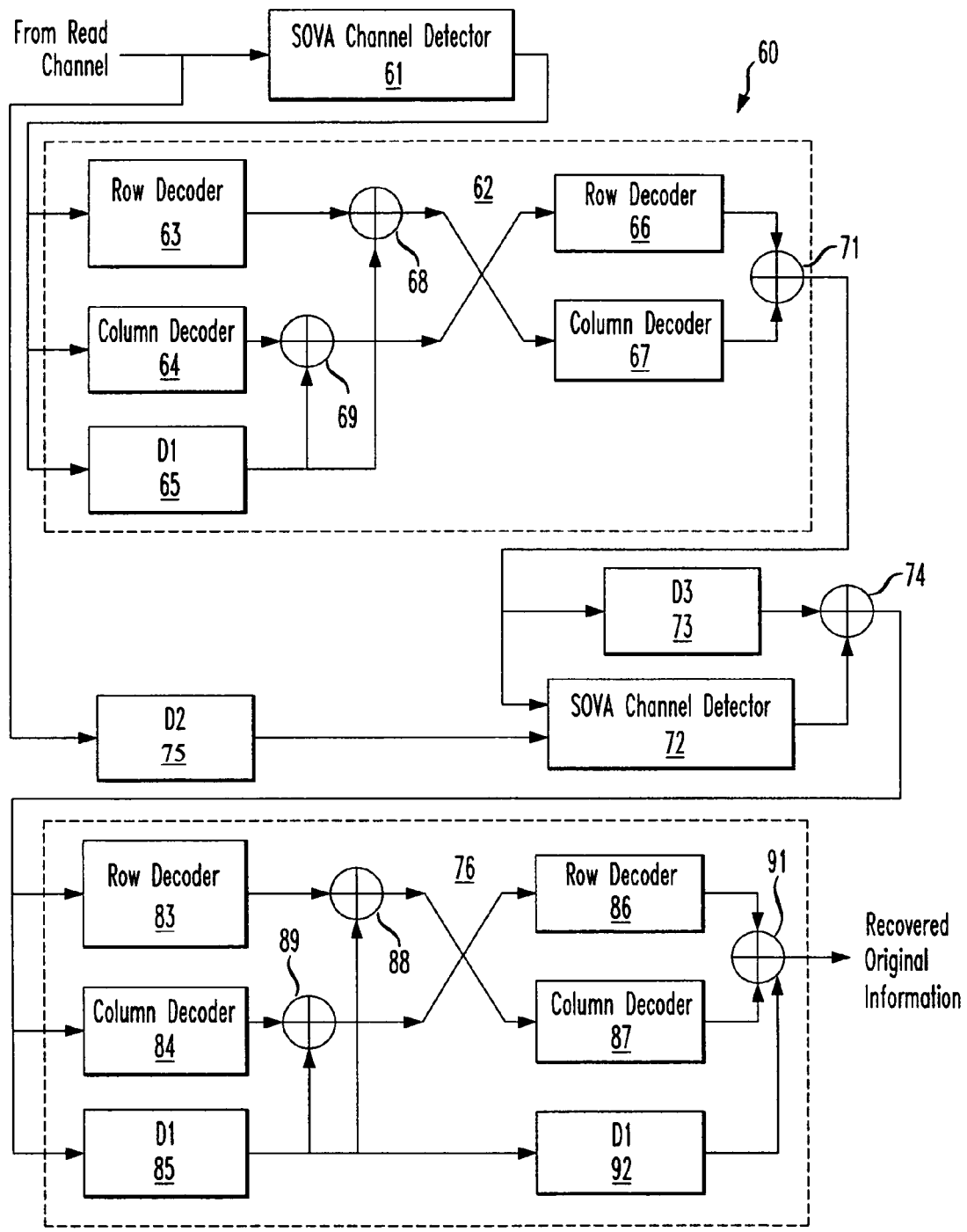
FIG. 2 shows a known combination of SOVA and channel detectors implementing the error correction scheme that utilizes both row and column parity.

In particular, it has been determined that increasing the amount of error correction data included with original data to allow for increasingly elaborate error correction schemes may actually decrease accuracy of the recovered original data in many situations. As just one of many examples, an elaborate error correction scheme such as that implemented by system 60 of FIG. 2 may require a number parity bits equivalent to twenty-five percent or more of the amount of original data. Where these parity bits are stored with the original data on a magnetic storage medium, inclusion of the parity bits results in substantial increase in the storage density of the original information. Increasing the storage density may cause a corresponding increase in errors in the original information before a selected error correction scheme is applied. In some cases, the chosen error correction scheme may be capable of detecting and correcting the increased errors. However, in some cases, the number of errors may exceed the ability of the chosen error correction scheme. In such a situation, an elaborate error correction scheme may actually be worse than not implementing an error correction scheme at all. This result is shown in FIG. 9A which provides a graph 500 depicting an error rate on an axis 510 plotted against steps in an error correction scheme on an axis 520. The steps are merely exemplary and may represent, for example, the step of initially accessing information from a storage device (S0), and the steps of providing a first, second and third error correction iteration (S1, S2, S3).

At step S0, the original information retrieved from the storage media exhibits an error rate E1 where parity bits sufficient to implement the chosen elaborate error correction scheme, or an error rate E2 where no parity bits are included with the original information and no error correction scheme is implemented. Where no error correction scheme is implemented, the error rate remains constant at E2 as depicted by a dashed line 550. In contrast, where the error rate E1 remains below a threshold error rate that is correctable by the elaborate error correction scheme, the error rate progressively decreases as depicted by a line 530 when each of the steps of the elaborate error correction scheme (S0-S3) are performed. Ultimately, the error correction saturates at an error rate E3 which is better than the error rate achieved where no error correction scheme is implemented. However, where the error rate E1 exceeds the threshold error rate that is correctable by the elaborate error correction scheme, the error correction scheme is unable to correct errors and the error rate remains basically constant at E1 as depicted by a dashed line 540. As shown, the error rate occurring where an error correction scheme is implemented may actually be worse than that achievable through eliminating the error correction scheme altogether.

Figure 7A:
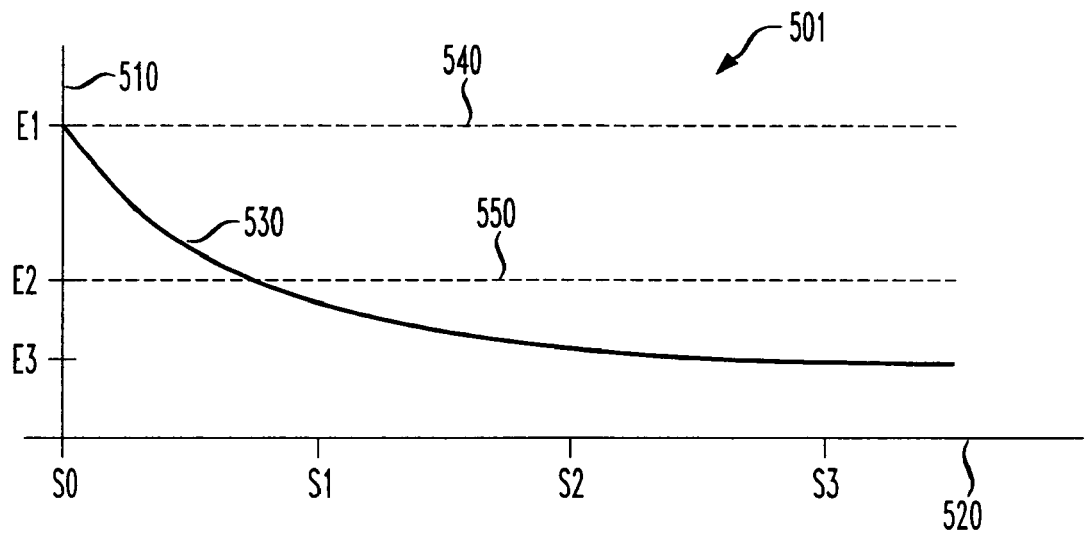
FIG. 7A depicts an exemplary potential increase in error rate due to implementation of an elaborate error correction scheme.
Figure 7B:
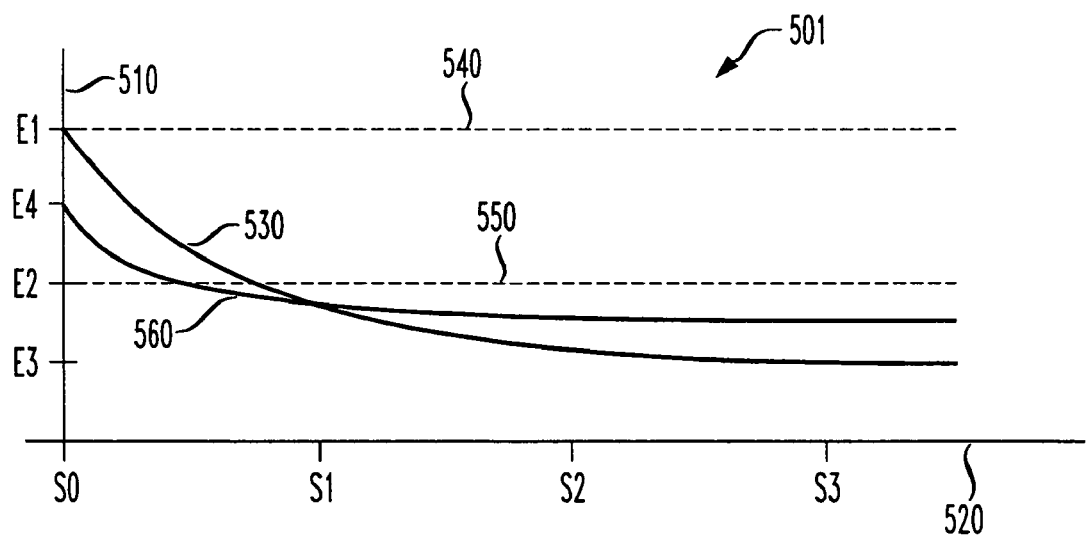
FIG. 7B depicts an exemplary error correction rate possible through use of embodiments of the present invention which is superimposed on the graph of FIG. 7A.

Various embodiments of the present invention may allow for substantially less error correction data to be incorporated with the original data. This allows for a reduction in the density of the stored data which may result in a corresponding reduction in the initial error rate (i.e., the error rate at step S0). Thus, while the possible reduction in error rate offered by embodiments of the present invention may be less than that offered by a more elaborate error correction scheme, it may be less likely that the possible reduction offered by embodiments of the present invention will not be achieved due to an excessive initial error rate. This situation is depicted in a graph 501 of FIG. 7A, where a line 560 representing an error rate achievable using an embodiment of the present invention is superimposed on graph 500 of FIG. 9A. Following the graph, line 560 begins with an initial error rate of E4 which is less than that of the more elaborate error correction scheme due to the reduced amount of error correction data included with the original information, and greater than the error rate E2 due to the increased data storage density.

In some cases, embodiments of the present invention may be implemented using substantially less memory and logic than that used to implement the SOVASP/SP error correction system taught in U.S. patent application Ser. No. 11/041,694, previously incorporated herein by reference for all purposes. Further, in some cases, embodiments of the present invention provide for an increase in signal to noise ratio, and an improvement in error reduction when compared with the aforementioned systems.

In conclusion, the present invention provides novel systems, methods and arrangements for error reduction. While detailed descriptions of one or more embodiments of the invention have been given above, various alternatives, modifications, and equivalents will be apparent to those skilled in the art without varying from the spirit of the invention. For example, while FIG. 5 shows applicability of embodiments of the present invention to two distinct systems, one of ordinary skill in the art will recognize other systems to which embodiments of the present invention are applicable including, but not limited to, digital storage systems, wireless communication systems, digital communication systems, digital subscriber lines, and/or the like. Further, while FIG. 4 shows an embodiment of the present invention using two iterative stages, one of ordinary skill in the art will recognize that three or more iterative loops may be utilized depending upon a particular design requirement. Therefore, the above description should not be taken as limiting the scope of the invention, which is defined by the appended claims.

What is claimed is:

1. A digital information system comprising:
a first channel detector, wherein the first channel detector is operable to receive an encoded data set, and wherein the first channel detector is operable to provide a first hard output and a soft output representing the encoded data set;
a single parity row decoder, wherein the single parity row decoder is operable to receive the first hard output and the soft output, wherein the single parity row decoder is operable to provide a second hard output, and wherein the second hard output is an error reduced representation of the encoded data set;
a delay element, wherein the delay element is operable to receive the encoded data set and is operable to provide a time shifted encoded data set; and
a second channel detector, wherein the second channel detector is operable to receive the second hard output unmodified coincident with a portion of the time shifted encoded data set, wherein the second channel detector is operable to provide a recovered output, and wherein the recovered output exhibits a reduction in errors compared with the encoded data set.

2. The digital information system of claim 1, wherein the second channel detector is a hard output Viterbi algorithm channel detector, wherein the hard output Viterbi algorithm channel detector is operable to provide a third hard output, and wherein the third hard output is an error reduced representation of the second hard output.

3. The digital information system of claim 1, wherein the soft output is a first soft output, wherein the first channel detector is a first soft output Viterbi algorithm channel detector, wherein the second channel detector is a second soft output Viterbi algorithm channel detector, and wherein the recovered output includes a second soft output and a third hard output.

4. The digital information system of claim 3, wherein the single parity row decoder is a first single parity row decoder, and wherein the digital information system further includes:
a second single parity row decoder, wherein the second single parity row decoder is operable to receive the second soft output and the third hard output, and wherein the second single parity row decoder is operable to provide a fourth hard output; and
a hard output Viterbi algorithm channel detector, wherein the hard output Viterbi algorithm channel detector is operable to receive the fourth hard output, wherein the hard output Viterbi algorithm channel detector is operable to provide a fifth hard output, and wherein the fifth hard output is an error reduced representation of the fourth hard output.

5. The digital information system of claim 1, wherein the encoded data set is derived from a base information, and wherein the digital information system further includes:
a single parity row by row encoder, wherein the single parity row by row encoder is operable to encode the base information with at least one parity bit decodable by the single parity row decoder.

6. The digital information system of claim 5, wherein the parity bit is chosen to create a parity check selected from a group consisting of: even parity and odd parity.

7. The digital information system of claim 1, wherein the digital information system is a digital storage system, wherein the second channel detector is a hard output Viterbi algorithm channel detector, wherein the hard output Viterbi algorithm channel detector is operable to provide a third hard output, wherein the third hard output is an error reduced representation of the second hard output, and wherein the digital storage system further includes:
- a storage medium, wherein the storage medium is coupled to a buffer, and wherein the buffer provides the input data from the storage medium; and
- a Reed Solomon decoder, wherein the third hard output is provided to the Reed Solomon decoder.

8. The digital information system of claim 1, wherein the digital information system is a digital communication system, wherein the second channel detector is a hard output Viterbi algorithm channel detector, wherein the hard output Viterbi algorithm channel detector is operable to provide a third hard output, wherein the third hard output is an error reduced representation of the second hard output, and wherein the digital storage system further includes:
- a transmission device, wherein the transmission device is operable to receive a base information, and wherein the transmission device includes a single parity row by row encoder operable to encode the base information with at least one parity bit to form the input data;
- a reception device, wherein the reception device is operable to receive the input data, wherein the reception device is coupled to a buffer, and wherein the buffer is operable to provide the input data from the reception device; and
- a Reed Solomon decoder, wherein the third hard output is provided to the Reed Solomon decoder.

9. The system of claim 1, wherein the encoded data set is derived from a storage medium.

10. The system of claim 1, wherein the first channel detector is a first hardware channel detector, and wherein the second channel detector is a second hardware channel detector.

11. The system of claim 1, wherein the single parity row decoder is a hardware single parity row decoder.

12. A data processing system, the system comprising:
- a first channel detector, wherein the first channel detector is operable to receive an encoded data set, and wherein the first channel detector is operable to provide a first hard output and a soft output representing the encoded data set;
- a parity row decoder, wherein the parity row decoder is operable to receive the first hard output and the soft output unmodified, and wherein the parity row decoder is operable to provide a second hard output;
- a delay element, wherein the delay element is operable to receive the encoded data set and is operable to provide a time shifted encoded data set; and
- a second channel detector, wherein the second channel detector is operable to receive the second hard output unmodified coincident with a portion of the time shifted encoded data set, and wherein the second channel detector is operable to provide a third hard output.

13. The system of claim 12, wherein the second channel detector is a Viterbi algorithm channel detector.

14. The system of claim 12, wherein the soft output is a first soft output, wherein the first channel detector is a first soft output Viterbi algorithm channel detector, wherein the second channel detector is a second soft output Viterbi algorithm channel detector.

15. The system of claim 14, wherein the parity row decoder is a first parity row decoder, and wherein the digital information system further includes:
- a second parity row decoder, wherein the second parity row decoder is operable to receive the second soft output and the third hard output, and wherein the second parity row decoder is operable to provide a fourth hard output; and
- a hard output Viterbi algorithm channel detector, wherein the hard output Viterbi algorithm channel detector is operable to receive the fourth hard output, and wherein the hard output Viterbi algorithm channel detector is operable to provide a fifth hard output.

* * * * *